US009875812B2

(12) United States Patent
Otterstedt et al.

(10) Patent No.: US 9,875,812 B2
(45) Date of Patent: Jan. 23, 2018

(54) HEALTH STATE OF NON-VOLATILE MEMORY

(71) Applicant: Infineon Technologies AG, Neubiberg (DE)

(72) Inventors: Jan Otterstedt, Unterhaching (DE); Christian Schneckenburger, Holzkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/875,063

(22) Filed: Oct. 5, 2015

(65) Prior Publication Data

US 2016/0125959 A1    May 5, 2016

(30) Foreign Application Priority Data

Oct. 31, 2014    (DE) .................. 10 2014 115 885

(51) Int. Cl.
| G11C 29/50 | (2006.01) |
| G11C 16/34 | (2006.01) |
| G11C 29/52 | (2006.01) |
| G11C 29/04 | (2006.01) |

(52) U.S. Cl.
CPC ...... *G11C 29/50016* (2013.01); *G11C 16/349* (2013.01); *G11C 29/50004* (2013.01); *G11C 29/52* (2013.01); *G11C 2029/0409* (2013.01)

(58) Field of Classification Search
CPC ........ G11C 29/50016; G11C 29/50012; G11C 29/5004; G11C 16/349; G11C 2029/0409
USPC ........................................................ 365/201
See application file for complete search history.

(56) References Cited

U.S. PATENT DOCUMENTS

| 4,963,825 | A | * | 10/1990 | Mielke | G11C 29/50 |
| | | | | | 365/201 |
| 5,339,279 | A | * | 8/1994 | Toms | G11C 16/16 |
| | | | | | 365/185.11 |
| 5,511,020 | A | * | 4/1996 | Hu | G11C 16/10 |
| | | | | | 257/E27.103 |
| 5,886,905 | A | * | 3/1999 | Yokozawa | G11C 29/50 |
| | | | | | 703/14 |
| 5,930,174 | A | * | 7/1999 | Chen | G11C 16/3404 |
| | | | | | 365/185.29 |
| 6,418,053 | B1 | * | 7/2002 | Parker | G11C 11/5628 |
| | | | | | 365/185.03 |
| 6,424,566 | B1 | * | 7/2002 | Parker | G11C 11/5628 |
| | | | | | 365/185.03 |
| 6,466,483 | B1 | * | 10/2002 | Parker | G11C 11/5628 |
| | | | | | 365/185.03 |

(Continued)

FOREIGN PATENT DOCUMENTS

DE    112004002836 T5    3/2007

OTHER PUBLICATIONS

German Patent Office, Office Action issued for DE 10 2014 115885.7, 6 pages, dated May 12, 2015. (German language only).

(Continued)

*Primary Examiner* — Vu Le
*Assistant Examiner* — Sung Cho
(74) *Attorney, Agent, or Firm* — Schiff Hardin LLP

(57) ABSTRACT

An embodiment relates to a method for determining a health state of a non-volatile memory comprising: determining the health state based on at least one indicator for determining a predictable failure of the non-volatile memory.

20 Claims, 3 Drawing Sheets

(56) References Cited

U.S. PATENT DOCUMENTS

| | | | | |
|---|---|---|---|---|
| 6,490,204 B2* | 12/2002 | Bloom | ............... | G11C 11/5671 365/185.19 |
| 7,372,732 B2* | 5/2008 | Wu | ................... | G11C 16/0466 365/185.03 |
| 8,243,520 B2* | 8/2012 | Chan | ................. | G11C 16/0483 365/185.19 |
| 9,251,891 B1* | 2/2016 | Hu | .................... | G11C 11/5642 |
| 9,329,948 B2* | 5/2016 | Li | ...................... | G06F 11/1666 |
| 2003/0141950 A1 | 7/2003 | Kim | | |
| 2005/0024978 A1* | 2/2005 | Ronen | ............... | G11C 11/5621 365/232 |
| 2006/0274583 A1* | 12/2006 | Lutze | ................... | G11C 16/12 365/185.28 |
| 2007/0276627 A1* | 11/2007 | Westerman | ........... | G06T 7/001 702/184 |
| 2008/0013360 A1* | 1/2008 | Hemink | ............. | G11C 11/5635 365/100 |
| 2008/0084737 A1* | 4/2008 | Tang | ................. | G11C 16/3404 365/185.3 |
| 2008/0123420 A1* | 5/2008 | Brandman | ......... | G06F 11/1072 365/185.09 |
| 2008/0126717 A1* | 5/2008 | Otterstedt | ........... | G06Q 20/341 711/154 |
| 2008/0192544 A1* | 8/2008 | Berman | ............. | G11C 11/5621 365/185.09 |
| 2009/0103371 A1* | 4/2009 | Goda | ................. | G11C 16/3468 365/185.29 |
| 2009/0154264 A1* | 6/2009 | Kux | .................... | G11C 16/349 365/189.16 |
| 2009/0238006 A1* | 9/2009 | Nobunaga | ............. | G11C 16/10 365/185.19 |
| 2009/0244962 A1* | 10/2009 | Gordon | ................... | G11C 8/10 365/163 |
| 2010/0082884 A1* | 4/2010 | Chen | ................... | G11C 16/349 711/103 |
| 2010/0097855 A1* | 4/2010 | Bayle | ................. | G11C 11/5628 365/185.03 |
| 2010/0107021 A1* | 4/2010 | Nagadomi | .......... | G06F 11/1068 714/704 |
| 2010/0157641 A1* | 6/2010 | Shalvi | ................. | G11C 16/349 365/45 |
| 2010/0199150 A1* | 8/2010 | Shalvi | ................. | G11C 16/344 714/773 |
| 2011/0047421 A1* | 2/2011 | Schuette | ............. | G11C 16/349 714/718 |
| 2011/0103150 A1* | 5/2011 | Chan | .................. | G11C 16/0483 365/185.19 |
| 2011/0242901 A1* | 10/2011 | Marquart | ............ | G11C 11/5628 365/185.19 |
| 2012/0224404 A1* | 9/2012 | Gurgi | ................. | G11C 11/5628 365/45 |
| 2012/0224423 A1* | 9/2012 | Gurgi | ................. | G11C 11/5628 365/185.03 |
| 2013/0044546 A1* | 2/2013 | Marquart | ............. | G11C 29/028 365/185.18 |
| 2013/0128666 A1* | 5/2013 | Avila | ................. | G06F 11/1048 365/185.11 |
| 2013/0145079 A1* | 6/2013 | Lee | .................... | G06F 12/0246 711/103 |
| 2014/0006688 A1* | 1/2014 | Yu | ......................... | G11C 16/10 711/103 |
| 2014/0289559 A1* | 9/2014 | Hashimoto | ........... | G11C 29/08 714/27 |
| 2015/0113207 A1* | 4/2015 | Shin | .................... | G06F 12/0246 711/103 |
| 2015/0205664 A1* | 7/2015 | Janik | .................. | G06F 11/1012 714/764 |

OTHER PUBLICATIONS

Communication dated Sep. 30, 2016 for German Application No. 102014115885.7.

* cited by examiner

HEALTH STATE OF NON-VOLATILE MEMORY

BACKGROUND OF THE INVENTION

Embodiments of the present invention relate to examples to determine and to utilize the health state (e.g., expected remaining life time) of a non-volatile memory.

SUMMARY

A first embodiment relates to a method for determining a health state of a non-volatile memory comprising:
  determining the health state based on at least one indicator for determining a predictable failure of the non-volatile memory.

A second embodiment relates to an integrated circuit comprising
  a non-volatile memory;
  circuitry for determining a health state of the non-volatile memory or a portion thereof based on at least one indicator for determining a predictable failure of the non-volatile memory.

A third embodiment relates to a system comprising
  at least one integrated circuit comprising a non-volatile memory;
  software or hardware that is arranged for determining a health state of the non-volatile memory or a portion thereof based on at least one indicator for determining a predictable failure of the non-volatile memory.

A fourth embodiment is directed to a device for determining a health state of a non-volatile memory comprising:
  means for determining the health state based on at least one indicator for determining a predictable failure of the non-volatile memory.

A fifth embodiment is directed to a computer program product directly loadable into a memory of a digital processing device, comprising software code portions for performing the steps of the method described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF THE PREFERRED EMBODIMENTS

Figure 1:
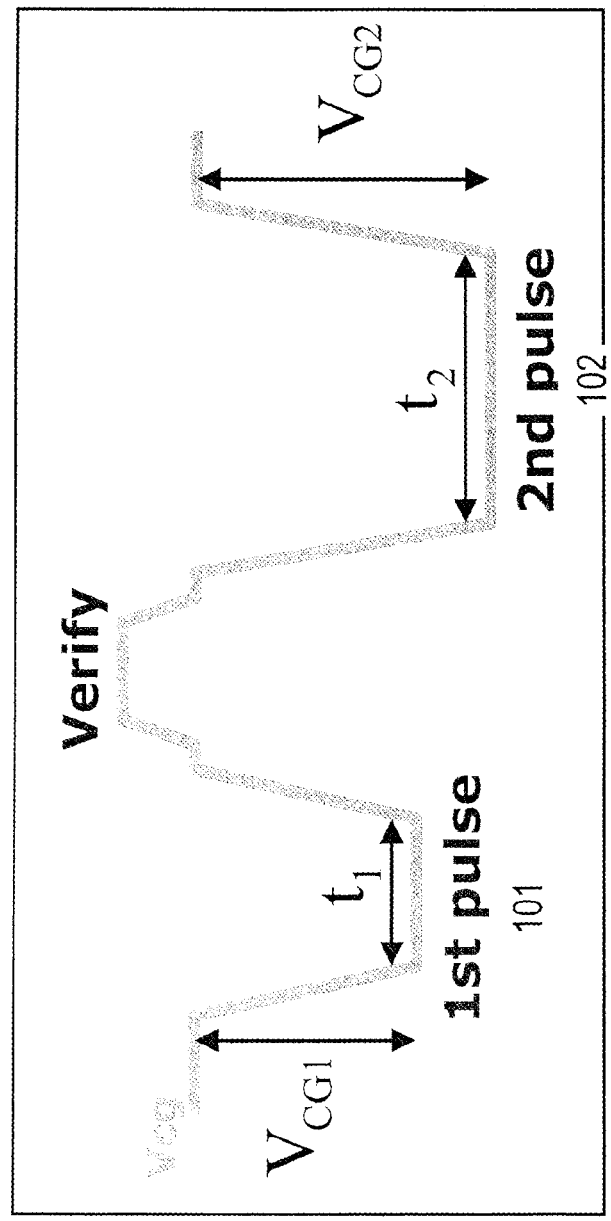
FIG. 1 shows a schematic diagram comprising two programming pulses.

In existing applications and use-case scenarios there is a general motivation to become aware of an impending failure of a memory, in particular an embedded non-volatile memory (NVM), before such failure actually occurs. This may allow scheduling a replacement in-time before the actual failure, but avoids replacing a device that is still working well.

Examples presented herein in particular allow checking the health of a device at the level of the device itself (e.g., NVM hardware) compared to an indirect and imprecise check at a level of the file system that utilizes the device via an operating system.

The term health (also: health state) may in particular refer to an information about the device that allows determining its actual state with respect to the overall (or remaining) life time of the device. Hence, the health may in particular allow determining, e.g., a time period or a number of operations the device may have left before a (uncorrectable) failure is expected. It is noted that the time left for the device and/or the number of operations the device may still be able to perform based on such health determined may be an estimate, which could be based, e.g., on previous experience and/or statistical figures.

Examples described herein in particular suggest at least one indicator about the NVM's health. Such indicator may be monitored utilizing NVM with predictive programming, a progressive erase method and/or a hard-read/normal-read threshold. As an option, the NVM may be vitalized via hardening, which could be an option to repair and/or improve the health of the NVM. Hence, examples in particular refer to self-monitoring, analysis and/or reporting of a health state of an embedded NVM.

S.M.A.R.T. (Self-Monitoring, Analysis and Reporting Technology; often written as SMART) is a monitoring system for computer hard disk drives (HDDs) and solid-state-drives (SSDs) to detect and report on various indicators of reliability, in the hope of anticipating failures (see http://en.wikipedia.org/wiki/S.M.A.R.T.). When a failure is anticipated by S.M.A.R.T., the user may choose to replace the drive to avoid unexpected outage or data loss.

There are in particular two different types of hard disk failures:
  Unpredictable failures happen suddenly and without warning. They range from electronic components becoming defective to a sudden mechanical failure (which may be caused by improper handling).
  Predictable failures result from slow processes such as mechanical wear and gradual degradation of storage surfaces. An imminent failure may be determined via monitoring. For example, an increased heat output, an increased noise level, problems with reading and/or writing of data, or an increase in the number of damaged sectors may indicate an imminent failure.

Independent of their concrete realization, for many electronic systems it is beneficial to keep the system alive (operative) for as long as possible and also not to wait too long for the system to actually fail.

An example refers to a control system of a wind turbine, which is located off-shore in the sea: It is expensive to replace the control system too early, but it is even more expensive, when an unscheduled maintenance visit is required to exchange the already defective control system.

There are many other use case scenarios or systems, e.g., industrial systems or automotive systems, for which it is preferred to replace a device prior to its actual failure.

In systems comprising at least one integrated circuit (IC) with an embedded NVM (e.g., a microcontroller with integrated non-volatile memory), this embedded NVM has a limited life time, which depends on parameters like
  a number of erase operations (overall and per page);
  a number of write operations (overall and per page or block);
  the temperature (during operation and during sleep- or off-states);

chip-individual specific properties, e.g., localized or chip-wide weaknesses, possibly caused by production process variations.

The life time of the NVM may determine the life time of the overall system. Examples presented herein provide self-monitoring, analysis and reporting for embedded NVMs, which may be enhanced by a self-repair functionality.

Embedded NVM failures may be of the following types:

Unpredictable failures that happen suddenly and without warning.

Predictable failures that result from slow or gradual degradation during operation.

Predicable failures may be based on at least one of the following:

The effectiveness of erase (or write) operations degrades with the number of write/erase cycles until at the end of life time the erase (or write) operation fails, i.e. the NVM cell does not reach the expected analog state anymore.

Read errors of NVM cells under special (hard) read conditions, i.e. some NVM cells do not yield correct data anymore under these special read conditions, e.g., because they have lost (or gained) charge and their analog state is disturbed so that data retention failures may occur.

Read errors of NVM cells occur, i.e. during normal operation of the NVM. In such case, some NVM cells do not yield correct data anymore, e.g., because they have lost (or gained) so much charge that their analog state is disrupted, which corresponds to a data retention failure.

In case a repair functionality of defective NVM cells is provided, the number of still available (unused) replacement cells is dwindling until all replacement cells are used up and no repair is possible anymore.

NVM Failure Indicators

The slow and gradual degradation of operation can be monitored by monitoring certain indicators that may reveal when such failures are becoming more likely (i.e. imminent). Such indicators may be, e.g.:

(1) Indicators for endurance failures (caused by erase/write cycling):

An increased amount of time, an increased amount of voltage and/or an increased number of pulses is required to conduct erase operations directed to at least one NVM cell (e.g., a portion of NVM cells or all NVM cells).

An increased amount of time, an increased amount of voltage and/or an increased number of pulses is required to conduct write operations directed to at least one NVM cell (e.g., a portion of NVM cells or all NVM cells).

(2) Indicators for data retention failures (DRF; caused by a time which has passed since the cell was programmed):

An increasing number of NVM cell read errors is detected under special (hard) read conditions utilizing a hard read level. The read errors may be correctable or non-correctable via an error correction code (ECC), i.e. via redundancy information that was added to the payload information.

(3) Indicator for endurance and data retention failures:

An increasing number of NVM cell read errors occur, which may be correctable or not correctable via ECC.

(4) Indicator for reaching the end of life (EOL):

A number of remaining or already used replacement units (e.g., blocks, pages, sectors) for repair of hard read, erase, or write errors diminishes (e.g., reaches or falls below a predetermined threshold).

NVM Failure Indicator Details: Increasing Time, Voltage and/or Number of Pulses for Erase Operations of at Least NVM Cell:

U.S. Pat. No. 8,243,520 B2 refers to a "Non-volatile memory with predictive programming" and it is herewith incorporated by reference.

FIG. 1 shows a schematic diagram comprising two programming pulses 101 and 102 of different duration $t_1$ and $t_2$. After the programming pulse 101 a verify (read operation) is conducted to determine how successful the programming pulse 101 was, i.e. how far the threshold voltage distribution of the NVM cells has been shifted. Depending on the result, the programming pulse 102 is conducted with the same or a different duration $t_2$ and the same or a different voltage $V_{GC2}$.

A fail count after the first programming (e.g., erase) pulse is indicative of a NVM cell's health state. Either the fail count itself or the derived (modified) voltage for the second erase pulse may indicate, how many more successful subsequent programming operations can be expected. This corresponds to the health state of the NVM cells.

As an option, a repair may be conducted in case the fail count after the first programming pulse is too high to indicate an expected success after a second programming pulse. Instead for the first and second programming pulse, this concept may apply for a programming pulse n and its subsequent programming pulse n+1.

As an alternative or in addition, a progressive erase method (PEM) may be used by applying several steps. After each step, the NVM cells are checked whether the erase operation was successful. In the affirmative, the erase operation is completed. If the erase operation was not successful, a next erase step is conducted, optionally with modified parameters, e.g., a modified erase voltage and/or a modified erase pulse length. After that, in a next step, the NVM cells are (again) checked whether the erase operation was successful, etc.

This may be repeated for a predetermined number of times, e.g., until the erase operation turned out to be successful or until a predefined number of iterations is reached.

The number of steps necessary to get the NVM cells successfully erased, the voltage required at the last step and/or its timing may indicate how many more write/erase cycles can be expected to be successfully conducted for these NVM cells in the future. This corresponds to the health state of the NVM cells.

Figure 2:
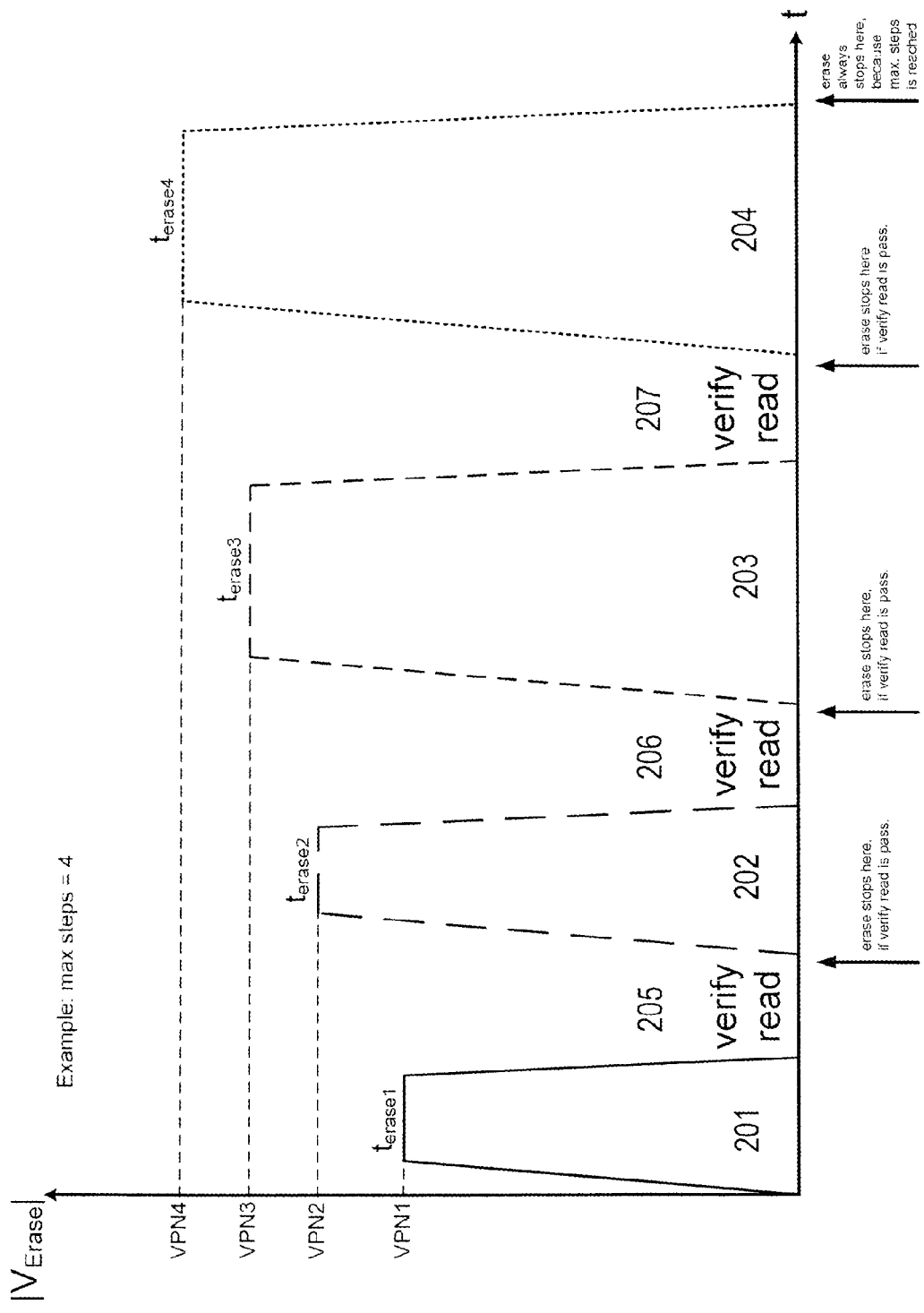
FIG. 2 shows a schematic diagram comprising four erase pulses.

FIG. 2 shows a schematic diagram comprising four erase pulses 201 to 204, wherein each erase pulse has a erase duration $t_{erase1}$ to $t_{erase4}$ and a erase voltage VPN1 to VPN4. Between the erase pulses 201 to 204 read operation 205 to 207 are conducted. The first read operation that turned out to be successful stops the erase process. As the maximum number of erase pulses is set to 4, the erase process always stops after the erase duration $t_{erase4}$ at the latest.

It is an option to conduct a repair if the predefined number of iterations is reached.

NVM Failure Indicator Details: Increasing Time, Voltage and/or Number of Pulses for Write Operations of at Least NVM Cell:

Similar to erase operation, degradation details as described above with regard to write operations may apply. With regard to the write operations, the health state of the NVM cells that are to be written is monitored.

NVM Failure Indicator Details: Increasing Number of NVM Cell Read Errors Under Special (Hard) Read Conditions, Correctable or not Correctable by ECC:

A gradual charge loss (based on the data retention problem) of written NVM cells over time leads to a gradual decrease of the NVM cells' threshold voltage $V_t$. A (self-) test may be performed to determine a state of the written NVM cells by checking their voltage $V_t$.

Figure 3:
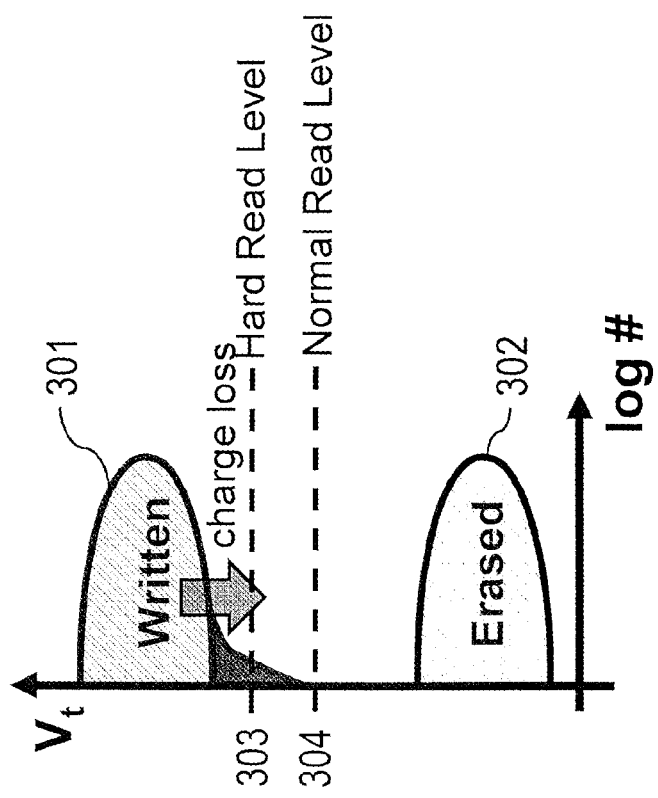
FIG. 3 shows an exemplary diagram comprising a distribution of threshold voltages for written NVM cells and a distribution of threshold voltages for erased NVM cells in view of different read levels.

FIG. 3 shows an exemplary diagram comprising a distribution of voltage $V_t$ for written NVM cells 301 and a distribution of voltage Vt for erased NVM cells 302. In addition, a hard read level 303 and a normal read level 304 are indicated.

For example, a read operation utilizing the hard read level may help determining whether the voltage $V_t$ for the NVM cells in the written state 301 has already dropped to a critical level. Such check can be performed and/or repeated with various read levels. The check may reveal a number of defective bits. This number of defective bits (or a gradual deterioration monitored over time) may indicate how long the NVM cells are expected to be readable utilizing the normal read level 304. At least some of the defective bits may be corrected via ECC. This ECC capability may also have an impact on the health state of the NVM cells by extending their effective life time.

As an option, an in-field rewrite may be implemented. In such case, the faulty bits may be repaired by at least one additional write operation (applying the same or different parameters, e.g., pulse length, pulse intensity, as the previous write operation). A number of rewrite operations may (also) indicate the health state of the NVM cells.

NVM Failure Indicator Details: Increasing Number of NVM Cell Read Errors, Correctable or not Correctable by ECC:

During normal operation or in during a (self-)test of the embedded NVM the number and type of ECC errors can be monitored (by applying, e.g., the normal read level).

The number of faulty bits determined and whether they are correctable by an optional ECC may indicate how long the NVM cells may be expected to successfully store content (i.e., its health state).

In case correctable ECC errors are found, a repair may be initiated.

NVM Failure Indicator Details: Number of Remaining or Already Used Replacement Units (e.g., Blocks, Pages, Sectors) for Repair of Hard Read, Erase, or Write Errors:

In case an in-field repair is implemented, the number of performed repairs or the number of remaining (or already used) replacement units, e.g., blocks, pages, sectors, may indicate the health state of the embedded NVM cells.

A repair may be performed directly replacing at least one NVM cell in case a failure occurs. As an alternative (or in addition), a repair may be first performed for the at least one NVM cell affected, i.e., this at least one NVM cell may be re-programmed (at least once). Such re-programming can be tried for several times, e.g., a predetermined number of times. If such predetermined number of times of re-programming is reached without having successfully programmed the at least one NVM cell, the data may be stored to the replacement unit (e.g., block, page, sector) of the NVM cells. The number of re-programming attempts may also be an indicator for the health state of the NVM.

NVM Failure Reporting

There are numerous options to initiate and/or provide failure reporting. A couple of them are outlined hereinafter.

If at least one of the indicators reaches and/or exceeds (or falls below) a predefined threshold, a predefined action may be triggered, e.g., a message is sent. Such message may comprise the fail count.

With a predefined timing (e.g., iteratively, continuously) at least one indicator is stored and compared with a threshold; if a predefined condition is met, an action may be triggered. For example, in case the number of re-writes amounts to a value, a message may be triggered.

It is also an option, to determine a change of at least one indicator based on, e.g., an actual value and at least one of its previous values to extrapolate and predict and report an end-of-life span for the NVM cells.

Also, a statistical value (e.g., mean, median, minimum, maximum) may be determined for at least one indicator and compared with a threshold. For example, the number of ECC corrections may be compared with such threshold which may lead to triggering a message.

A log of all indicators that exceed thresholds may be stored and sent at predetermined moments of time.

As an option, intermediate values may be stored in the NVM cells itself or in a random access memory (RAM).

It is noted that determining the indicators and any derived values may be performed by software and/or by hardware. The hardware may in particular partially utilize dedicated circuits.

The examples suggested herein may in particular be based on at least one of the following solutions. In particular combinations of the following features could be utilized in order to reach a desired result. The features of the method could be combined with any feature(s) of the device, apparatus or system or vice versa.

A method for determining a health state of a non-volatile memory is provided, the method comprising:
  determining the health state based on at least one indicator for determining a predictable failure of the non-volatile memory.

The non-volatile memory (NVM) may comprise several memory cells (also referred to as NVM cells). The NVM can be an embedded memory in a device, e.g., an integrated circuit.

Monitoring the at least one indicators allows determining the health of the NVM which may then be used for predicting a failure or a remaining life time (e.g., cycle time) of the NVM.

In an embodiment, the indicator is an indicator for an endurance failure, which is caused by erase operations and/or write operations.

In an embodiment, the indicator for the endurance failure is determined based on an increased amount of time, an increased amount of signal amplitude and/or an increased amount of pulses applied by erase operations and/or write operations.

As an option, the time (duration) of an erase operation or a write operation may be extended for the respective operation to become successful. The duration may be increased stepwise until the erase or write operation shows the required result (which can be determined by a subsequent read operation). The duration successfully applied may be compared with at least one predefined threshold in order to become aware how many successful (erase or write) operations can still be expected for this particular NVM. The threshold and their mapping to the remaining life time may be based on previous and/or statistical knowledge.

In a similar manner, the signal amplitude (e.g., erase voltage) may be increased until a successful erase can be determined. The signal amplitude that actually lead to the successful erase operation can be compared with at least one threshold to predict the remaining life time (cycle number) of the NVM.

Accordingly, the indicator for the endurance failure may comprise a number of times an erase operation is used before a portion of the NVM is successfully erased. This number can be compared with predefined thresholds (which may be stored as a look-up table) to indicate a remaining life time for the NVM. The thresholds and their mapping to the remaining life time may be based on previous and/or statistical knowledge.

It is noted that a single threshold may be used to determine that the NVM needs to be replaced. The threshold can be defined in a way that the NVM will (most likely) still be operational for an amount of time that is (on average) required for replacing the NVM. It is further noted that replacing the NVM may include replacing a component which comprises the NVM.

In an embodiment, the indicator is an indicator for a data retention failure.

In an embodiment, the indicator for the data retention failure is determined based on an increased amount of read errors.

In an embodiment, the indicator for the data retention failure is determined based on an increased amount of read errors that is determined under a hard read condition utilizing a hard read level.

The hard read level is a read level that can be used to detect a charge loss of NVM cells that are in their written state. Compared to a normal read level, the hard read level may be closer to the distribution of the voltage of the NVM cells in their written state.

In an embodiment, the read errors are at least partially correctable by utilizing an error correction code.

For example, redundancy information (additional bits) may be added to payload data and this redundancy information allows correcting read errors to a certain extend. The amount of redundancy information added may thus prolong the life time of the NVM. It is an option to consider the read errors even if they may be corrected by utilizing the redundancy. It also an option to not consider the read errors as long as they can be corrected by utilizing the redundancy.

In an embodiment, the indicator for the data retention failure is determined based on an increased amount uncorrectable read errors.

The read errors may be determined under normal operation of the NVM or during its start-up, self-test or test.

In an embodiment, the indicator is an indicator determined based on an decreasing amount of replacement units used for repair purposes.

A number of remaining or already used replacement units (e.g., blocks, pages, sectors) for repairing cells that indicated errors diminishes (e.g., reaches or falls below a predetermined threshold), which indicates that the NVM will soon not be able to provide and repair functionality. For example, a threshold of remaining replacement units may be used to trigger a replacement of the NVM.

In an embodiment, the method comprises
triggering a predefined action in case the health state wherein the health state fulfills a predefined condition.

The health state or the at least one indicator may fulfill a condition that indicates that, e.g., the NVW has deteriorated to a certain extent. In such case the predefined action may be triggered.

In an embodiment, the predefined action comprises a report or message.

The report or message can be sent to a monitoring instance, e.g., processing unit that may use it to indicate the status of the NVM and/or to initiate a maintenance task (e.g., replacement of the NVM or the components in which the NVM is embedded).

The message may comprise an indication of the health state in certain stage, e.g., "good", "likely to fail", "fail imminent". Also, a numeric value may indicate the likelihood of an imminent failure. It is another option that a failure class is determined for various indicators, e.g., "data retention", "endurance issue" and "running out of repair capability". Each such class may be accompanied with a numeric value that shows the severity of the issue.

In an embodiment, the predefined condition may be based on the at least one indicator and determine a statistical value to be compared with at least one threshold.

The statistical value may comprise a mean, a median, a minimum, a maximum of the at least one indicator.

It is also an option to store a log of all indicators or a portion thereof that may exceed thresholds. Also, such indicators may be sent to the monitoring instance at predetermined moments of time.

It is an option to provide the decision whether the NVM is to be replaced on the device comprising the NVM or by the monitoring instance.

In an embodiment, the non-volatile memory is at least one of the following:
an EEPROM;
a floating gate NVM;
a flash memory;
a PCRAM;
a RRAM;
a CBRAM;
a nano-crystal NVM;
a MONOS device;
a TANOS device;
a MRAM.

An integrated circuit is suggested, comprising
a non-volatile memory;
circuitry for determining a health state of the non-volatile memory or a portion thereof based on at least one indicator for determining a predictable failure of the non-volatile memory.

In an embodiment, the integrated circuit is a microcontroller, a microprocessor or an ASIC.

It is noted that the features described above are in particular applicable for the integrated circuit, device, system or computer program product as described herein.

A system is provided, said system comprising
at least one integrated circuit comprising a non-volatile memory;
software or hardware that is arranged for determining a health state of the non-volatile memory or a portion thereof based on at least one indicator for determining a predictable failure of the non-volatile memory.

The health state may in particular be communicated and/or determined outside the integrated circuit by, e.g., a monitoring instance. A predefined action can be triggered by the system or outside the system in case the health state (and/or the at least one indicator) fulfills a predetermined condition. One of the predetermined actions may be to initiate or to plan a replacement of the integrated circuit or portion of the system that comprises the integrated circuit (e.g. a board that is placed in a rack of a control system). Another action is to trigger an in-system repair by, e.g., trying multiple write or erase operations with different parameters (cycle time, pulse length, voltage, iteration, etc.).

It is a further option to use replacement units to repair the errors determined (see also above).

A device is suggested for determining a health state of a non-volatile memory comprising:
means for determining the health state based on at least one indicator for determining a predictable failure of the non-volatile memory.

Also, a computer program product is provided, which is directly loadable into a memory of a digital processing device, comprising software code portions for performing the steps of the method as described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for determining a health state of a non-volatile memory comprising:
iteratively stepwise adjusting a preceding signal amplitude applied in a corresponding preceding erase or write operation to determine a stepwise adjusted signal amplitude to be applied by a current erase or write operation until the current erase or write operation is successful;
determining a number of iterations of the stepwise adjustments;
determining an indicator based on the stepwise adjusted signal amplitude of the successful erase or write operation and the number of iterations of the stepwise adjustments; and
determining the health state based on the indicator to determine a predictable failure of the non-volatile memory.

2. The method according to claim 1, wherein the indicator is an indicator for an endurance failure, which is caused by erase operations and/or write operations.

3. The method according to claim 1, wherein the indicator is an indicator for a data retention failure.

4. The method according to claim 3, wherein the indicator for the data retention failure is determined based on an increased amount of read errors.

5. The method according to claim 3, wherein the indicator for the data retention failure is determined based on an increased amount of read errors that is determined under a hard read condition utilizing a hard read level.

6. The method according to claim 3, wherein the read errors are at least partially correctable by utilizing an error correction code.

7. The method according to claim 3, wherein the indicator for the data retention failure is determined based on an increased amount uncorrectable read errors.

8. The method according to claim 1, wherein the indicator is an indicator determined based on an decreasing amount of replacement units used for repair purposes.

9. The method according to claim 1, comprising
triggering a predefined action in case the health state wherein the health state fulfills a predefined condition.

10. The method according to claim 9, wherein the predefined action comprises a report or message.

11. The method according to claim 9, wherein the predefined condition may be based on the indicator and determine a statistical value to be compared with at least one threshold.

12. The method according to claim 1, wherein the non-volatile memory is at least one of the following:
an EEPROM;
a floating gate NVM;
a flash memory;
a PCRAM;
a RRAM;
a CBRAM;
a nano-crystal NVM;
a MONOS device;
a TANOS device; and
a MRAM.

13. A computer program product directly loadable into a memory of a digital processing device, comprising software code portions for performing the steps of the method according to claim 1.

14. The method according to claim 1, further comprising: iteratively stepwise adjusting a duration of the preceding erase or write operation applied in the corresponding preceding erase or write operation to determine a stepwise adjusted signal duration to be applied by the current erase or write operation until the current erase or write operation is successful, wherein determining the indicator is further based on the stepwise adjusted signal duration of the successful erase or write operation.

15. The method according to claim 1, wherein determining the predictable failure of the non-volatile memory comprises determining a remaining lifetime of the non-volatile memory.

16. The method according to claim 15, wherein determining the remaining lifetime of the non-volatile memory comprises determining an estimated time period before the non-volatile memory suffers the predictable failure.

17. The method according to claim 16, wherein determining the remaining lifetime of the non-volatile memory further comprises determining an estimated number of successful erase or write operations that can be performed before the non-volatile memory suffers the predictable failure.

18. An integrated circuit comprising:
a non-volatile memory; and
circuitry configured to:
iteratively stepwise adjust a preceding signal amplitude applied in a corresponding preceding erase or write operation to determine a stepwise adjusted signal amplitude to be applied by a current erase or write operation until the current erase or write operation is successful;
determine a number of iterations of the stepwise adjustments;
determine an indicator based on the stepwise adjusted signal amplitude of the successful erase or write operation and the number of iterations of the stepwise adjustments; and
determine a health state of the non-volatile memory or a portion thereof based on the indicator to determine a predictable failure of the non-volatile memory.

19. The integrated circuit according to claim 18, wherein the integrated circuit is a microcontroller, a microprocessor or an ASIC.

20. A system comprising:
at least one integrated circuit comprising a non-volatile memory; and
a processor that is configured to:
iteratively stepwise adjust a preceding signal amplitude applied in a corresponding preceding erase or write operation to determine a stepwise adjusted signal amplitude to be applied by a current erase or write operation until the current erase or write operation is successful;
determine an indicator based on the stepwise adjusted signal amplitude of the successful erase or write operation and the number of iterations of the stepwise adjustments; and
determine a health state of the non-volatile memory or a portion thereof based on the indicator to determine a predictable failure of the non-volatile memory.

* * * * *